United States Patent [19]
Sakai et al.

[11] Patent Number: 6,034,409
[45] Date of Patent: Mar. 7, 2000

[54] ISOLATION TRENCH HAVING PLURAL PROFILE ANGLES

[75] Inventors: Maiko Sakai; Takashi Kuroi; Katsuyuki Horita, all of Tokyo, Japan

[73] Assignee: Mitsubishi Denki Kabushiki Kaisha, Tokyo, Japan

[21] Appl. No.: 09/024,312

[22] Filed: Feb. 17, 1998

[30] Foreign Application Priority Data

Aug. 28, 1997 [JP] Japan .................................... 9-232561

[51] Int. Cl.$^7$ .................................................. H01L 27/10
[52] U.S. Cl. .......................................... 257/506; 257/774
[58] Field of Search ........................... 257/774, 330–334, 257/506; 438/640, 701, 713, 978, 638

[56] References Cited

U.S. PATENT DOCUMENTS

| | | |
|---|---|---|
| 4,855,017 | 8/1989 | Douglas . |
| 5,746,884 | 5/1998 | Gupta et al. .......................... 156/643.1 |
| 5,801,083 | 9/1998 | Yu et al. ................................. 438/424 |

FOREIGN PATENT DOCUMENTS 5-259269  8/1993  Japan .

OTHER PUBLICATIONS

B.H. Roh, et al, "Highly Manufacturable Shallow Trench Isolation for Giga Bit DRAM," Ext. Abst SSDM 1995, pp. 590–592.

*Primary Examiner*—David B. Hardy
*Attorney, Agent, or Firm*—McDermott, Will & Emery

[57] ABSTRACT

A semiconductor device comprising a semiconductor substrate, a trench formed in the substrate and having an inner wall including a sidewall and a bottom surface, a silicon oxide film deposited on the inner wall, and a buried oxide film deposited on the silicon oxide film to bury the trench, wherein the sidewall has portions of a sidewall sloped at a first profile angle A1, a second profile angle A2 and a third profile angle A3 from a surface of the substrate toward the bottom surface of the trench, and the profile angles have a relationship of A1<A2, A3<A2 and A1<83°.

2 Claims, 6 Drawing Sheets

ISOLATION TRENCH HAVING PLURAL PROFILE ANGLES

BACKGROUND OF THE INVENTION

1. Field of the Invention

The present invention relates to the structure of a semiconductor device and a method for preparing the structure, in particular to a trench structure of device isolation region for electrically isolating devices and a method for preparing the trench structure.

2. Background of the Invention

In FIG. 9, there is shown a conventional process for fabricating a semiconductor device which has a device isolation region formed therein. In FIG. 9 is shown the formation of a device isolation region disclosed in JP-A-5259269.

In accordance with the conventional process, a trench is formed so as to have a sidewall bent in a two-stage fashion from a surface of a semiconductor substrate toward a bottom thereof, and then thermal oxidation is carried out to form a device isolation region having a silicon oxide film in the trench.

In the formation of the device isolation according to the conventional method, a silicon oxide film 102 and a silicon nitride film 103 are sequentially deposited on the surface 101a of the semiconductor substrate 101, and a resist pattern 104 which has a window 104a formed therein so as to correspond to a device isolation region forming portion is deposited on the silicon nitride film 103 as shown in FIG. 9(a).

Next, the silicon nitride film 103 is subjected to an anisotropic etching with use of the resist pattern 104 as an etching mask to dig a portion of the silicon nitride film under the window 104a as shown in FIG. 9(b).

Further, the silicon oxide film 102 is etched by RIE (Reactive Ion Etching) with use of the resist pattern 104 as an etching mask to dig a portion of the silicon oxide film under the windows 104a, thereby exposing a portion of the surface 101a of the semiconductor substrate 101 under the window as shown in FIG. 9(c).

The portion of the surface 101a of the semiconductor substrate 101 is continuously subjected to RIE to be digged down, providing a trench 105 having a profile angle 105a as shown in FIG. 9(d). At that time, a fluorocarbon polymer film 106 is simultaneously created and is deposited on a sidewall of the window 104a.

After that, the semiconductor substrate 101 is subjected to isotropic etching with use of the fluorocarbon polymer film 106 as an etching mask to further dig the trench 105, providing a trench 107 having a substantially vertical sidewall as shown in FIG. 9(e).

Next, the resist pattern 104 and the fluorocarbon polymer film 106 are eliminated as shown in FIG. 9(f).

After that, the device isolation region can be formed by providing a silicon oxide film on the trench 107 by thermal oxidation though not shown.

As explained, in the device isolation region formed according to the conventional method, the trench 107 is formed so as to have such a vertical sidewall, and the silicon oxidation film is deposited on the trench by thermal oxidation. As a result, a great deal of stress is applied to a bent portion with a bottom surface and the sidewall of the trench 107 contacting each other, and a defect is caused in the semiconductor substrate 101 by the stress, creating a problem in that device isolation characteristics degrade.

In general, a device isolation region which is provided by a trench in a semiconductor substrate and burying an isolating film in the trench for electrically isolating devices is called trench isolation. The formation of the trench isolation has a problem in that an edge portion suffers from a inverse narrow channel effect wherein the subthreshold characteristics of a transistor formed near to the trench isolation is adversely affected by a parasitic MOS transistor and wherein the threshold voltage of the transistor lowers as the size of the channel width is reduced. This is because the presence of a steep angle at a trench edge near to the surface of the substrate having the silicon oxide film for the device isolation with the substantially vertical sidewall causes an electric field from a gate electrode to concentrate on the trench edge when a voltage is applied to the gate electrode.

In addition, there is created a problem in that the oxidation of a surface of the device isolation region and the oxidation of a surface of an active region around it are different from each other in terms of oxidation rate, and an oxidation film which is formed on the active region and required for formation of a gate oxidation film as a constituent element of a MOS transistor is made into a thin film.

The device isolation region has to be buried at a position deeper than a predetermined depth in order to ensure required device isolation characteristics.

In the fabrication, the trench 107 is formed so as to have the stepwise sidewall by etching under two kinds of different conditions with use of the single etching mask. In the etching wherein the fluorocarbon polymer film 106 is created and deposited on the sidewall of the etching mask, the fluorocarbon polymer film 106 deposited on the sidewall peels at random during the etching, and some of a plurality trenches finally formed in a single substrate have uneven shapes, creating a problem in that devices formed around the device isolation region are adversely affected in terms of electrical sense.

SUMMARY OF THE INVENTION

It is an object of the present invention to solve these problems, and to provide a semiconductor device including a trench isolation capable of ensuring required device isolation characteristics and obtaining good electrical characteristics, and a method for manufacturing the device.

According to a first aspect of the present invention, there is provided a semiconductor device which comprises a semiconductor substrate; a trench formed in the substrate and having an inner wall including a sidewall and a bottom surface; a silicon oxide film deposited on the inner wall; and a buried oxide film deposited on the silicon oxide film to bury the trench; wherein the sidewall has portions of a sidewall sloped at a first profile angle A1, a second profile angle A2 and a third profile angle A3 from a surface of the substrate toward the bottom surface of the trench, and the profile angles have a relationship of A1<A2, A3<A2 and A1<83°.

According to a second aspect of the present invention, the silicon oxide film is deposited by subjecting the substrate to thermal oxidation.

According to a third aspect of the present invention, there is provided a method for manufacturing a semiconductor device, which comprises patterning an etching mask having a window on a surface of a semiconductor substrate; forming a sidewall deposit on a sidewall of the window; subjecting the substrate to first etching with use of the etching mask and the sidewall deposit to form a first trench in the substrate; eliminating the sidewall deposit; subjecting the substrate to second etching with use of the etching mask to dig the first trench and form a second trench so as to occupy a region corresponding to the window in the substrate; depositing a silicon oxide film on an inner wall of the second trench by thermal oxidation; depositing a buried oxide film on the silicon oxide film to bury the second trench; and eliminating the etching mask; wherein the second trench is formed so as to have portions of a sidewall sloped at a first profile angle A1, a second profile angle A2 and a third profile angle A3 from the surface of the substrate toward a bottom surface of the second trench, and the profile angles have a relationship of A1<A2, A3<A2 and A1<83°.

According to a fourth aspect of the present invention, there is provided a method for manufacturing a semiconductor device, which comprises patterning an etching mask having a window on a surface of a semiconductor substrate; forming a first sidewall deposit on a sidewall of the window; subjecting the substrate to first etching with use of the etching mask and the first sidewall deposit to form a first trench in the substrate; reducing a size of the first sidewall deposit in a horizontal direction to form a second sidewall deposit; subjecting the substrate to second etching with use of the second sidewall deposit and the etching mask to dig the first trench and form a second trench; eliminating the second sidewall deposit; depositing a silicon oxide film on an inner wall of the second trench by thermal oxidation; depositing a buried oxide film on the silicon oxide film to bury the second trench; and eliminating the etching mask; wherein the second trench is formed so as to have portions of a sidewall sloped at a first profile angle A1, a second profile angle A2 and a third profile angle A3 from the surface of the substrate toward a bottom surface of the second trench, and the profile angles have a relationship of A1<A2, A3<A2 and A1<83°.

According to a fifth aspect of the present invention, there is provided a method for manufacturing a semiconductor device, which comprises patterning an etching mask having a window on a surface of a semiconductor substrate; subjecting the substrate to first etching with use of the etching mask to form a first trench in the substrate so as to have a sidewall sloped at a first profile angle A1; forming a sidewall deposit on a sidewall of the window and a sidewall of the first trench; subjecting the substrate to second etching with use of the sidewall deposit and the etching mask to dig down the first trench and form a second trench; eliminating the sidewall deposit; depositing a silicon oxide film on an inner wall of the second trench by thermal oxidation; depositing a buried oxide film on the silicon oxide film to bury the second trench; and eliminating the etching mask; wherein the second trench is formed so as to have portions of a sidewall sloped at the first profile angle A1 and a second profile angle A2 from the surface of the substrate toward a bottom surface of the second trench, and the profile angles have a relationship of A1<A2 and A1<83°.

According to a sixth aspect of the present invention, the sidewall deposit, or the first and second sidewall deposits are made of a silicon oxide film in the methods according to the third through the fifth aspect of the present invention.

In accordance with the first aspect, a trench structure of device isolation region is formed so that the trench has the sidewall bent in the three-stage fashion of the first profile angle A1, the second profile angle A2 and the third profile angle A3 from the substrate surface toward the bottom surface of the trench, that the profile angles have the relationship of A1<A2, A3<A2 and A1<83°, and that a portion of the device isolation region contacting with the substrate surface is formed so as to have a gentle profile angle. When the substrate surface is oxidized to form a gate isolating film after formation of the device isolation region, a decrease in film thickness at a boundary between the device isolation region and an active region can be restrained, and the second profile angle A2 is set to be a relatively larger angle so as to increase a size of the device isolation region in a depth direction, offering an advantage in that sufficient device isolation characteristic are ensured.

In accordance with the second aspect, the trench which provides the device isolation region is formed so that the bottom surface of the trench contacts with the sidewall of the trench at a gentle profile angle. When the silicon oxide film as a constituent element of the device isolating region is deposited by thermal oxidation, a stress which is applied to the silicon substrate can be minimized.

In accordance with the third aspect, a trench structure of device isolation region is formed so that the trench has the sidewall bent in a three-stage fashion at the first profile angle A1, the second profile angle A2 and the third profile angle A3, that the profile angles have the relationship of A1<A2, A3<A2 and A1<83°, and that a portion of the device isolation region contacting with the substrate surface is formed so as to have a gentle profile angle. When the substrate surface is oxidized to form a gate isolating film after formation of the device isolation region, a decrease in film thickness at a boundary between the device isolation region and an active region can be restrained. The second profile angle A2 can be set to be a relatively larger angle so as to increase a size of the device isolation region in a depth direction, providing a semiconductor device which can ensure sufficient device isolation characteristics.

In accordance with the fourth aspect, a trench structure of device isolation region is formed so that the sidewall deposit which has been formed on the sidewall of the window of the etching mask used in the first etching is thinned, and that the thinned sidewall deposit is used as a mask in the second etching to the semiconductor substrate. The size of the device isolation region in the horizontal direction can be controlled so as to be minute without being restricted by the size of the window formed in the etching mask.

In accordance with the fifth aspect of the present invention, a trench structure of device isolation region is formed so that the sidewall deposit is formed on the sidewall of the etching mask and on the sidewall of the first trench formed in the semiconductor substrate for the second etching to the substrate. The sidewall of the first trench is prevented from losing the shape. The thickness of the sidewall in a horizontal direction can be adjusted to provide a desired size or easy control to the sidewall of the finally formed second trench having the first profile angle A1.

In accordance with the sixth aspect, the sidewall deposit, or the first and second sidewall deposits are made of a silicon oxide film in the methods according to the third through the fifth aspect. When etching is carried out with use of the sidewall deposit or the sidewall deposits as a part of the etching mask, the sidewall deposit or the sidewall deposits can be prevented from peeling to provide a good shape to the trench, allowing the device isolation region to be formed in a good shape.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

EMBODIMENT 1

A first embodiment of the present invention will be described.

Figure 1:
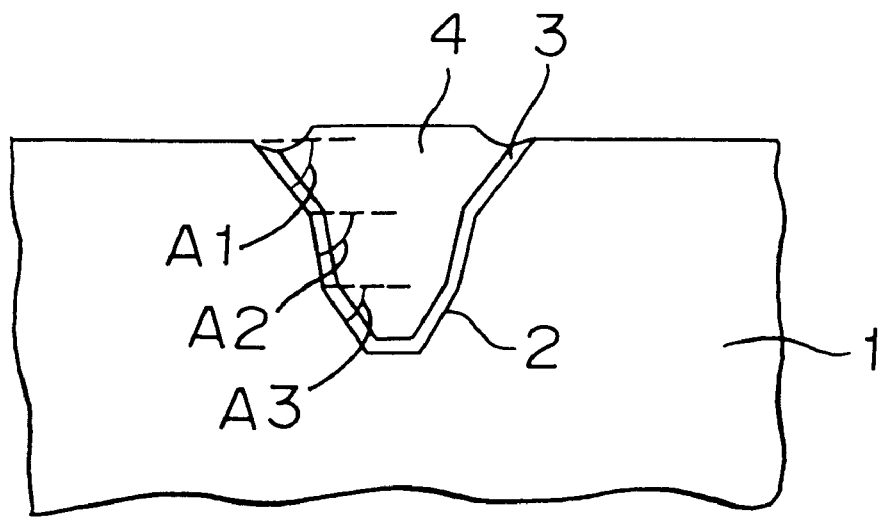
FIG. 1 is a schematic cross-sectional view showing the semiconductor device according to the first embodiment of the present invention.

In FIG. 1, there is shown cross-sectional view of a portion of a semiconductor device which can be formed according to the present invention, and wherein a device isolation region is shown.

In FIG. 1, reference numeral 1 designates a semiconductor substrate. Reference numeral 2 designates a trench which is formed by subjecting the semiconductor substrate 1 to etching, which has a sidewall bent in a three-stage fashion, and which has a bottom surface formed in parallel with a surface of the semiconductor substrate. Reference numeral 3 designates a silicon oxide film which is formed on the sidewall and the bottom surface (or the inner wall) of the trench. Reference numeral 4 designates a buried oxide film which is deposited on the silicon oxide film 3 to bury the trench 2.

The trench 2 has the sidewall bent in such a three-stage fashion so that the sidewall is bent at a first slope angle (first profile angle) A1, a second slope angle (second profile angle) A2 and a third slope angle (third profile angle) A3 from the surface of the substrate 1 toward the bottom surface of the trench 2. The sidewall of the trench contacts with the bottom surface of the trench which is in parallel with the surface of the substrate 1. The profile angles A1, A2 and A3 have a relationship of A2>A1, A2>A3, A1<83°, providing good electrical characteristics to the device isolation region.

Now, a method for forming the device isolation region shown in FIG. 1 will be explained referring to FIG. 2.

An underlying oxide film 5 having a film thickness of about 5 nm–about 50 nm and a nitride film 6 having a film thickness of about 100 nm–about 500 nm are sequentially deposited on the surface of the silicon substrate 1 as shown in FIG. 2(a). An etching mask which has a pattern (window) taken out is formed on a region to form the device isolation region, and the nitride film 6 and the underlying oxide film 5 are subjected to anisotropic etching to form windows in the nitride film and the underlying oxide film. A silicon oxide film is deposited so as to have a film thickness of about 10 nm–about 200 nm by a CVD (chemical vapor deposition) method. By anisotropic etching, a surface of the nitride film 6 and a portion of the surface of the substrate 1 corresponding to the windows are exposed, and a sidewall oxide film 7 is deposited on the sidewalls of the windows of the nitride film 6 and the underlying oxide film 5.

The surface of the substrate 1 is subjected to anisotropic etching with use of the nitride film 6 and the sidewall oxide film 7 as an etching mask to form a trench 2a having a profile angle of 75°–90° as shown in FIG. 2(b). The depth of the trench 2a is controlled so as to be about 50 nm–about 500 nm from the surface of the substrate 1. The trench 2a has a bottom surface in parallel with the surface of the substrate 1.

After that, the sidewall oxide film 7 is eliminated with an HF (hydrogen fluoride) treatment as shown in FIG. 2(c).

Next, etching is carried out under conditions that the first profile angle A1 formed in the substrate 1 is about 45°–about 80°, forming a trench 2 having a depth about 30 nm–about 300 nm as shown in FIG. 2(d). In this etching, a portion of the substrate 1 under the sidewall oxide film 7 eliminated by the previous step, and the bottom surface of the trench 2a are etched.

The profile angles and the size of the windows have to be adjusted to have a bottom surface of the trench 2 leveled by this etching.

The sidewall of the trench 2 is formed so that the sidewall has an upper portion near to an upper end of the trench 2 sloped at the first profile angle A2, a middle portion below the upper portion sloped at the second profile angle A2, and a lower portion sloped at the third profile angle A3 (the respective profile angles are angles of the respective sloped portions with respect to the surface of the substrate 1). The lower portion of the sidewall sloped at the third profile angle A3 contacts with the level bottom surface.

In this stage of etching, the profile angles A1 and A3 of the trench are adjusted so as to be smaller than the profile angle A2 provided by the sidewall of the first trench 2a.

After that, the silicon oxide film 3 is deposited on the inner wall of the trench 2 by thermal oxidation, and a buried oxidation film 4a is deposited on the entire surface of the substrate by a CVD method as shown in FIG. 2(e).

Further, etch back is carried out up to an upper surface of the nitride film 6 by a CMP (Chemical Mechanical Polishing) method with use of the nitride film 6 as a stopper so as to leave the buried oxide film 4a in the trench 2 and in the window of the nitride film 6 above the trench 2 as shown in FIG. 2(f).

After that, the silicon nitride film 6 is eliminated by thermal phosphoric treatment, and the underlying oxide film 6 is eliminated by a hydrofluoric acid treatment. A large portion of the buried oxide film 4 which has been deposited at a portion above the trench 2 higher than the surface of the substrate 1 is eliminated by these treatments to obtain the buried oxide film 4 which buries the trench 2 as shown in FIG. 1.

Figure 3:
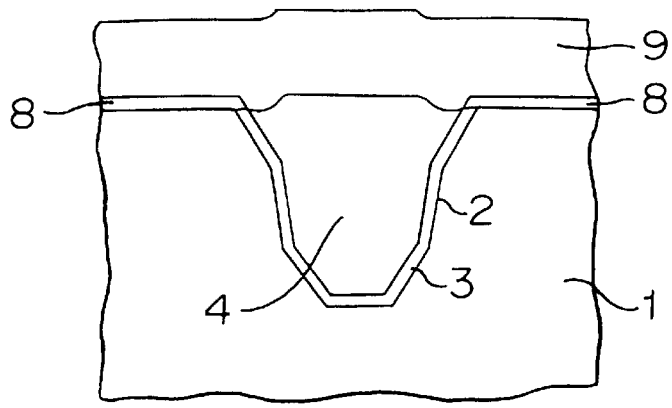
FIG. 3 is a schematic cross-sectional view showing the semiconductor device according to the first embodiment.

In FIG. 3, there is shown an example of a semiconductor device wherein gate isolating films 8 and a gate electrode 9 constituting a MOS transistor are formed near to the device isolation region after completion of the device isolation region shown in FIG. 1.

In FIG. 3, the gate isolating films 8 are prevented from being made into a thin film at a boundary between the buried oxide film 4 forming the device isolation region and the surface of the substrate 1. Even if a voltage is applied to the gate electrode of the MOS transistor near to the device isolation region, an electric field can be restrained from concentrating on an edge portion of the device isolation region to provide good device characteristics.

Figure 4:
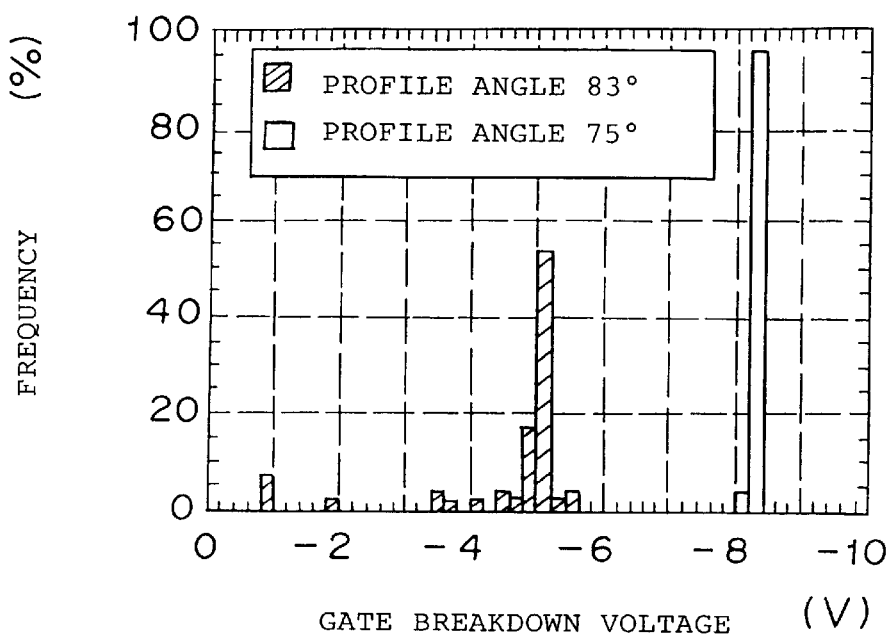
FIG. 4 is a graph explaining the first embodiment.

In FIG. 4, there are shown gate breakdown voltages which were measured under conditions that the first profile angle A1 was 75° and 83° when flat capacitors are formed near to a trench structure of device isolation region shown in FIG. 1.

FIG. 4 shows that the gate breakdown voltages at the first profile angle A1 of 75° are in a narrow range between −8.0 V and −8.4 V and exhibit stable electric characteristics though the gate breakdown voltages at the first profile angle A1 of 83° spread in a wide range between −5.6 V and −0.8 V to exhibit unstable electric characteristics.

Although FIG. 4 shows the data that were obtained at the first profile angle A1 of 75° and at the first profile angle A1 of 83°, the inventors have found that gate breakdown voltages have the tendency to exhibit good electrical characteristics when the first profile angle A1 is less than 83°.

The lower limit of the first profile angle A1 varies greatly with an area occupied by the device isolation region (the size in a horizontal direction). This is because the first profile angle A1 must be set to be a relatively larger angle in order to obtain a required depth of device isolation when the area occupied by the device isolation region is required to be minimized.

If the first profile angle A1 is set at a small value, and if the difference between the first profile angle A1 and the second profile angle A2 is great, the semiconductor substrate 1 which has the silicon oxide film 3 formed on the inner wall of the trench 2 by thermal oxidation is subjected to a stress, degrading the electrical characteristics of a finally obtained semiconductor device. Considering it, the size of the first profile angle A1 must be determined so as not to make the difference between the first profile angle A1 and the second profile angle A2 great.

The sidewall of the trench 2 has the portions sloped in the three-stage fashion at the first profile angle A1, the second profile angle A2 and the third profile angle A3 from the surface of the substrate 1 toward the bottom surface of the trench 2 so that the profile angles have the relationship of A2>A1 and A2>A3. The sidewall of the trench 2 contacts with the bottom surface of the trench 2 at the third profile angle A3. As a result, the stress which is applied to a boundary between the sidewall and the bottom surface when the silicon oxide film 3 is deposited on the inner wall of the trench 2 by thermal oxidation can be minimized to restrain a defect from occurring in the substrate 1.

Since the sidewall oxide film 7 is used as a part of the etching mask when the trench 2 is formed, the sidewall oxide film 7 can be prevented from peeling during etching, thereby providing a stable shape to the trench 2. It is possible to form a plurality of device isolation regions in a single substrate in a good shape without causing variations at a step wherein the plural device isolation regions are formed.

Although explanation of the first embodiment has been made with respect to a case wherein the etching mask which is formed on an active region for formation of the device isolation region has a two-layered structure with the underlying oxide film 5 and the nitride film 6 included therein, the present invention is not limited to this case. It is possible to fabricate a similar semiconductor device by providing the etching mask with e.g. a three-layered structure of nitride film/polysilicon film/oxide film or another three-layered structure of oxide film/polysilicon film/oxide film.

Since the first etching is carried out after the sidewall oxide film 7 has been deposited on the sidewalls of the underlying oxide film 5 and the nitride film 6 as the etching mask, there is no possibility that a fluorocarbon polymer film 106 peels to make the shape of plural trenches variable as in the conventional method. As a result, all device isolation regions on a single substrate can be formed in the same shape, stabilizing the electrical characteristics of semiconductor devices.

EMBODIMENT 2

Now, a second embodiment of the present invention will be explained.

Figure 5:
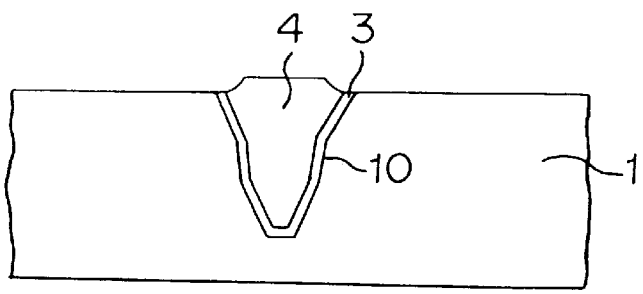
FIG. 5 is a schematic cross-sectional view showing the semiconductor device according to a second embodiment of the present invention.

In FIG. 5, there is shown a cross-sectional view of essential portions of the semiconductor device according to the second embodiment, wherein the device isolation region has a smaller size than the one of the first embodiment in a horizontal direction. The device isolation region according to the second embodiment has the same size as the one of the first embodiment in a vertical direction.

In FIG. 5, reference numeral 10 designates a trench which is formed by selectively etching the semiconductor substrate 1, and in which the silicon oxide film 3 and the buried oxide film 4 for forming the device isolation region are buried. Since the trench 10 is formed so that the trench 10 has a smaller size than the trench of the first embodiment shown in FIG. 1 in the horizontal direction, the device isolation region according to the second embodiment has a smaller volume than the one according to the first embodiment.

Now, a method for forming the device isolation region shown in FIG. 5 is described.

Figure 2:
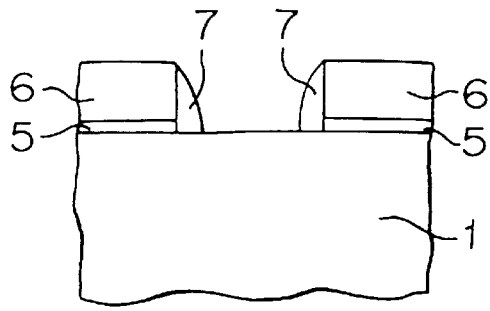
FIGS. 2(a)–2(f) are schematic diagrams showing the fabrication of the semiconductor device according to the first embodiment.
Figure 2:
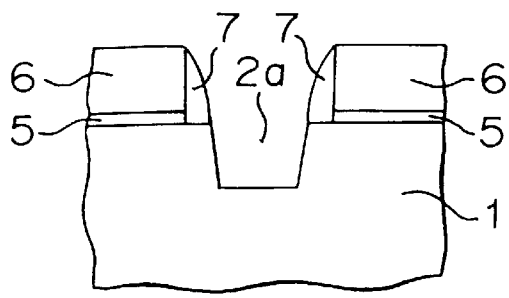
Figure 2:
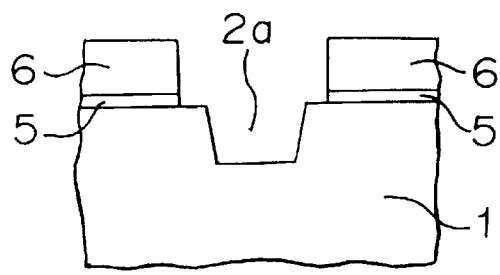
Figure 2:
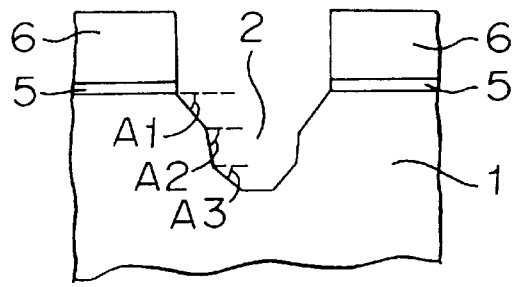
Figure 2:
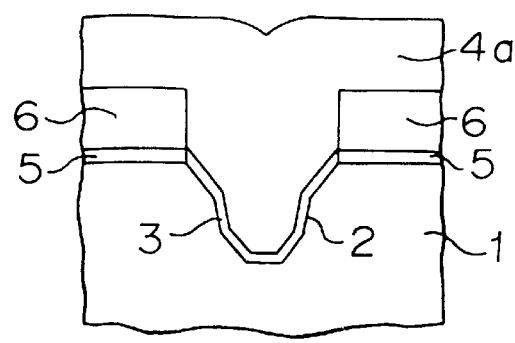
Figure 2:
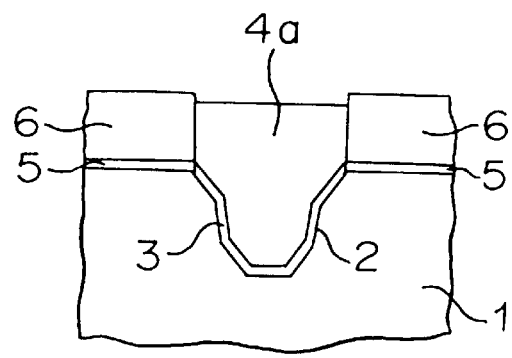

First, the same steps as the ones shown in FIGS. 2(*a*)–(*b*) with respect to the first embodiment are carried out to form a trench 2*a* in the semiconductor substrate 1. The trench 2*a* is formed so as to have a sidewall sloped at a profile angle between 75° and 90° with respect to the surface of the substrate 1.

Figure 6:
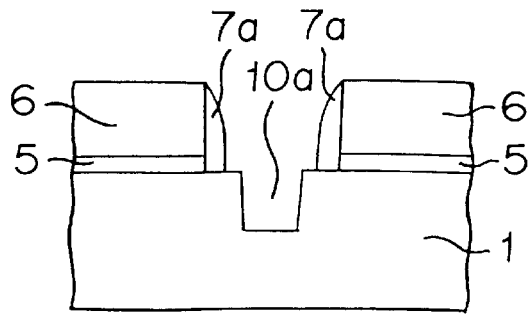
FIGS. 6(a)–6(c) are schematic diagrams showing the fabrication of the semiconductor device according to the second embodiment.
Figure 6:
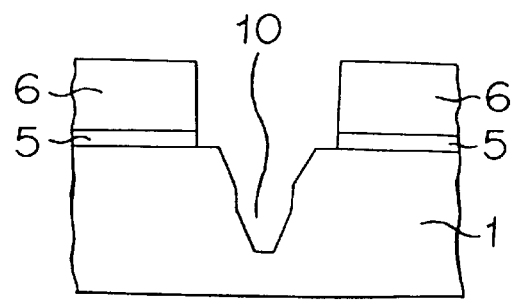
Figure 6:
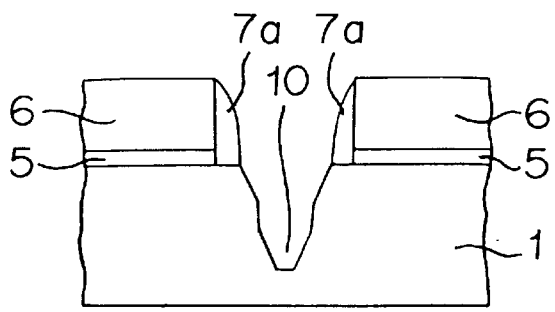

Then, a surface portion of the sidewall oxide film 7 made of a silicon oxide film is selectively etched by an HF treatment to be eliminated, forming a sidewall oxide film 7*a* having a film thickness of about 10 nm–about 150 nm as shown in FIG. 6(*a*). The HF concentration at which the sidewall oxide film 7*a* is formed by the HF treatment must be a low concentration in order to minimize the etch rate and increase controllability. The trench 10*a* shown in FIG. 6(*a*) corresponds to the trench 2*a* shown in FIG. 2(*b*).

Next, the semiconductor substrate 1 is etched with use of the nitride film 6 and the sidewall oxide film 7*a* as an etching mask to dig the trench 10*a*, providing the trench 10 as shown in FIG. 6(*b*). The conditions for etching are determined so that the trench 10 has an upper slant portion and a lower slant portion of a sidewall sloped at a profile angle of about 45°–about 80°, and that the trench 10 has a depth of about 30 nm about 300 nm.

At this stage, the trench 10 has portions of the sidewall sloped at the first profile angle A1, the second profile angle A2 and the third profile angle A3 from the surface of the substrate 1 toward the bottom surface of the trench 10.

Next, the sidewall oxide film 7*a* is eliminated by an HF treatment as shown in FIG. 6(*c*).

After that, the same steps as those of the first embodiment are carried out to deposit the silicon oxide film 3 on the inner wall of the trench 10, and the buried oxide film 4 is buried in the trench 10, providing the device isolation structure shown in FIG. 5.

Since the device isolation region according to this embodiment has a size in the horizontal direction reduced as shown in FIG. 5, the volume which is required for device isolation in the substrate 1 can be decreased, relatively increasing a portion of the substrate which can be used as active regions.

When the second embodiment is carried out so that the first profile angle A1 at the surface of the substrate 1 is set to be about 45°–about 80°, or smaller than 83° as the device isolation region according to the first embodiment, the film thickness of a gate isolating film at a boundary between the device isolation region and an active region can be restrained from being extremely made small at the time of forming a device such as a MOS transistor near to the device isolation region. The trench 10 has the sidewall contacted with the bottom surface of the trench at the third profile angle A3 of 45°–80°, offering an advantage in that the stress which is applied to the substrate 1 at the time of forming the silicon oxide film 3 by thermal oxidation can be reduced.

EMBODIMENT 3

Now, a third embodiment of the present invention will be described. In the first embodiment and the second embodiment, the trench 2 and the trench 10 are formed in the semiconductor substrate to provide the device isolation region, and the respective trenches have portions of the sidewall sloped in a three-stage fashion at the profile angles A1, A2 and A3. In the third embodiment, the device isolation region is formed in a trench which has portions of a sidewall sloped in a two-stage fashion at a first profile angle A1 and a second profile angle A2.

Figure 7:
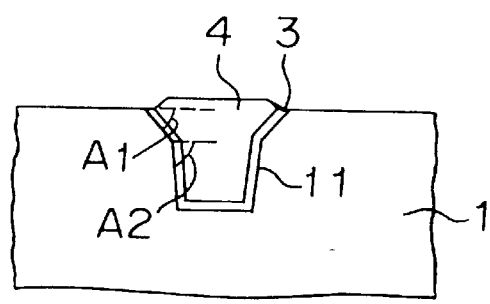
FIG. 7 is a schematic cross-sectional view showing the semiconductor device according to a third embodiment of the present invention.

In FIG. 7, there is shown a cross-sectional view of the device isolation region according to the third embodiment.

In this Figure, reference numeral 11 designates the trench in which the device isolation region is buried. Identical or corresponding portions are indicated by the same reference numerals as those used for explanation of the first and the second embodiment.

Now, a method for forming the device isolation region shown in FIG. 7 will be explained.

Figure 8A:
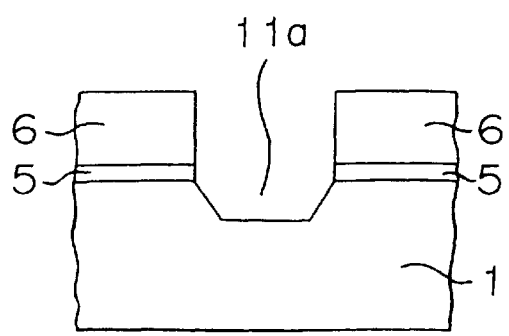
FIGS. 8(a)–8(d) are schematic diagrams showing the fabrication of the semiconductor device according to the third embodiment.

First, the underlying oxide film 5 is deposited on the surface of the semiconductor substrate 1 so as to have a film thickness of about 5 nm–about 50 nm, the nitride film 6 is deposited on the underlying oxide film so as to have a film thickness of about 100 nm–about 500 nm, a portion of the underlying oxide film 5 and a portion of the nitride film 6 above a region to form the device isolation region are selectively etched to form windows, and the substrate 1 is etched with use of the nitride film 6 as an etching mask to form a trench 11a having a depth of about 30 nm–about 300 nm as shown in FIG. 8(a). The trench 11a has a sidewall sloped at the first profile angle A1 of about 45°–about 80° with respect to the surface of the substrate 1.

Figure 8B:
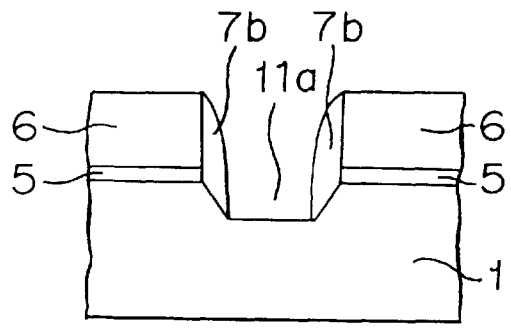

After that, a CVD oxide film is deposited, and the CVD oxide film is subjected to anisotropic etching to form a sidewall oxide film 7b which is deposited on a sidewall of the trench 11a and a sidewall of the windows in the underlying oxide film 5 and the nitride film 6 as shown in FIG. 8(b). The sidewall oxide film 7b is formed so that the sidewall oxide film covers the sidewall of the trench 11a and that a bottom surface of the trench 11a is exposed.

Figure 8C:
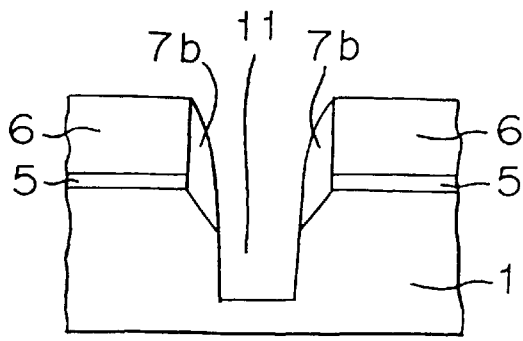

Next, the semiconductor substrate 1 is subjected to etching by an HF treatment with use of the sidewall oxide film 7b and the nitride film 6 as an etching mask to dig the trench 11a, providing a trench 11 as shown in FIG. 8(c). The conditions for etching are determined so that the trench 11 has a portion of a sidewall sloped at a second profile angle A2 of about 75°–about 90° and has a depth of about 50 nm–about 500 nm. The second profile angle A2 is determined so as to be greater than the first profile angle A1.

Figure 8D:
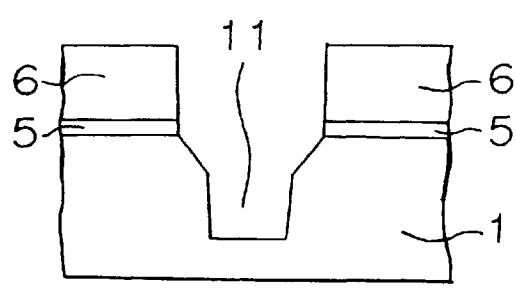
Figure 9A:
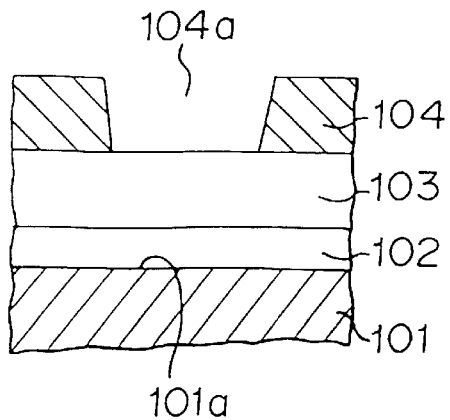
FIGS. 9(a)–9(f) are schematic diagrams explaining a conventional fabrication method.
Figure 9B:
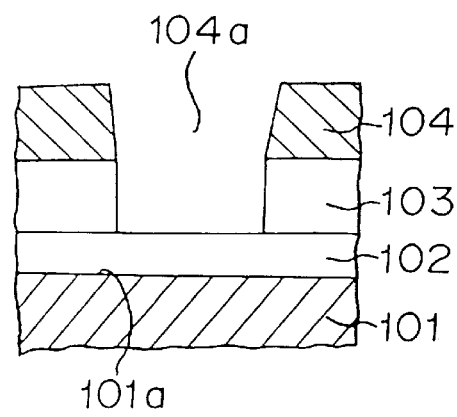
Figure 9C:
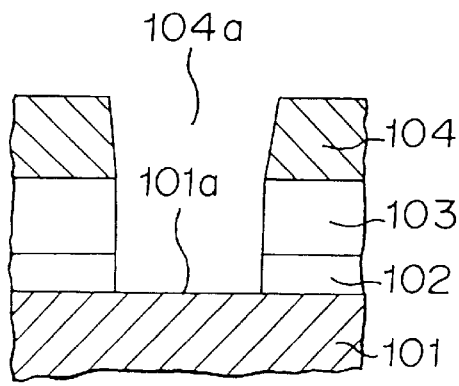
Figure 9D:
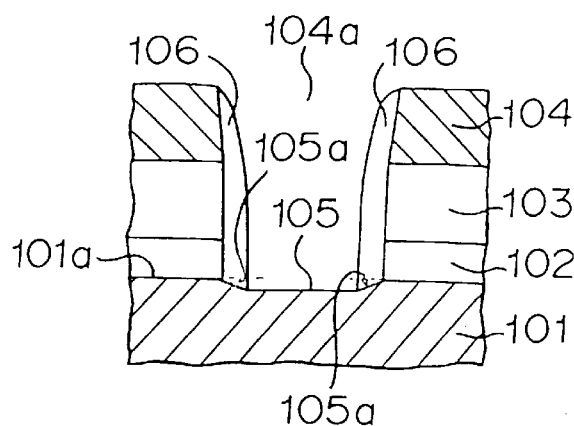
Figure 9E:
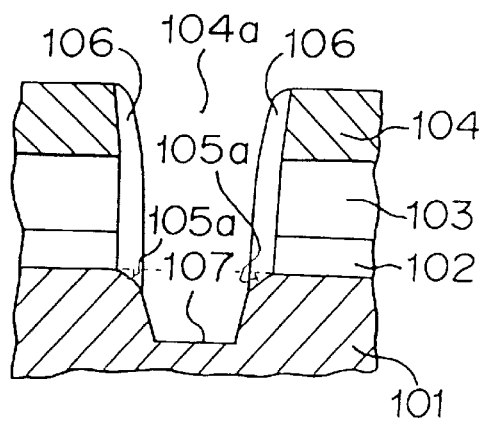
Figure 9F:
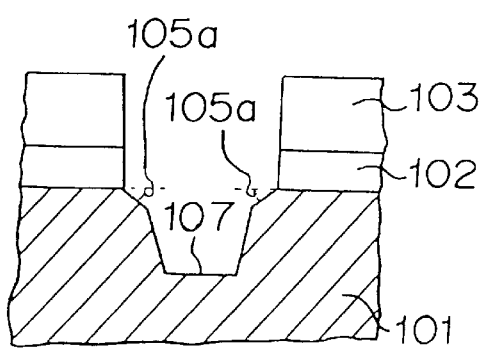

Then, the sidewall oxide film 7b is eliminated by an HF treatment as shown in FIG. 8(d).

After that, the silicon oxide film 7 is formed on the inner wall of the trench 11 by thermal oxidation as in the first and the second embodiment, and the buried oxide film 4 is buried in the trench 11 by a CVD method to provide the device isolation region shown in FIG. 7.

In the device isolation region formed according to such a fabrication method, the sidewall oxide film 7b is formed so as to completely cover the sidewall of the trench 11a at the time of subjecting the substrate 1 to the second etching. As a result, the sidewall is prevented from losing the shape, and the trench 11 can be formed with good controllability.

The length of the portion of the sidewall sloped at the first profile angle A1 can be easily controlled to a desired value by adjusting the thickness of the sidewall oxide film 7b in the horizontal direction.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor device comprising:

a semiconductor substrate;

a trench formed in said substrate and having an inner wall including a sidewall and a bottom surface;

a silicon oxide film deposited on said inner wall; and a buried oxide film deposited on said silicon oxide film to bury said trench;

wherein said sidewall has portions of a sidewall sloped at a first profile angle A1, a second profile angle A2 and a third profile angle A3 from a surface of said substrate toward said bottom surface of said trench, and said profile angles have a relationship of A1<A2, A3<A2 and A1<83°.

2. The semiconductor device according to claim 1, wherein said silicon oxide film is deposited by subjecting said substrate to thermal oxidation.

* * * * *